(12) United States Patent
Agarwal

(10) Patent No.: US 8,495,530 B2
(45) Date of Patent: Jul. 23, 2013

(54) RETARGETING FOR ELECTRICAL YIELD ENHANCEMENT

(75) Inventor: Kanak B. Agarwal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/526,984

(22) Filed: Jun. 19, 2012

(65) Prior Publication Data

US 2012/0260223 A1    Oct. 11, 2012

Related U.S. Application Data

(63) Continuation of application No. 12/630,216, filed on Dec. 3, 2009, now Pat. No. 8,230,372.

(51) Int. Cl.
*G06F 17/50* (2006.01)

(52) U.S. Cl.
USPC .............. 716/56; 716/50; 716/51; 716/54; 716/55

(58) Field of Classification Search
None
See application file for complete search history.

(56) References Cited

U.S. PATENT DOCUMENTS

| | | | |
|---|---|---|---|
| 6,578,190 B2 | 6/2003 | Ferguson et al. | |
| 6,961,916 B2 | 11/2005 | Sarrafzadeh et al. | |
| 6,961,920 B2 | 11/2005 | Zach | |
| 6,978,438 B1 | 12/2005 | Capodieci | |
| 7,237,221 B2 | 6/2007 | Granik et al. | |
| 7,318,214 B1 | 1/2008 | Prasad et al. | |
| 7,325,224 B2 | 1/2008 | Seltmann et al. | |
| 7,355,673 B2 | 4/2008 | Hsu et al. | |
| 7,396,621 B2 | 7/2008 | Fujisawa | |
| 7,434,199 B2 | 10/2008 | Cobb et al. | |
| 7,451,068 B2 | 11/2008 | Melvin, III | |
| 7,487,490 B2 * | 2/2009 | Zhang et al. | 716/50 |
| 7,694,267 B1 * | 4/2010 | Ye et al. | 716/53 |
| 7,784,019 B1 | 8/2010 | Zach | |
| 7,865,864 B2 | 1/2011 | Banerjee et al. | |
| 8,146,026 B2 | 3/2012 | Agarwal et al. | |
| 8,230,372 B2 | 7/2012 | Agarwal | |
| 2005/0026310 A1 | 2/2005 | Zhao et al. | |
| 2005/0196682 A1 | 9/2005 | Hsu et al. | |
| 2005/0223350 A1 * | 10/2005 | Zhang et al. | 716/21 |
| 2006/0024850 A1 | 2/2006 | Monahan et al. | |
| 2006/0026541 A1 | 2/2006 | Melvin, III et al. | |

(Continued)

OTHER PUBLICATIONS

U.S. Appl. No. 12/024,188, 2 pages.

(Continued)

*Primary Examiner* — A. M. Thompson
(74) *Attorney, Agent, or Firm* — Francis Lammes; Stephen J. Walder, Jr.; Eustus D. Nelson

(57) ABSTRACT

A mechanism is provided for electrical yield enhancement retargeting of photolithographic layouts. Optical proximity correction is performed on a set of target patterns in order to produce a set of optical proximity correction mask shapes. A set of lithographic contours is generated for each of the set of optical proximity correction mask shapes. A determination is made of electrical yield sensitivities for at least one shape in a set of shapes in the set of target patterns. A determination is also made as to an amount and a direction of retargeting for each shape in the set of shapes based on the electrical yield sensitivity of the shape. A new set of target patterns with retargeted edges is generated for each shape based on the amount and the direction of retargeting.

15 Claims, 9 Drawing Sheets

U.S. PATENT DOCUMENTS

| | | |
|---|---|---|
| 2006/0277521 A1 | 12/2006 | Chen et al. |
| 2007/0209030 A1 | 9/2007 | Tabery et al. |
| 2007/0266362 A1 | 11/2007 | Lai et al. |
| 2008/0022255 A1 | 1/2008 | Zach |
| 2008/0046846 A1 | 2/2008 | Chew et al. |
| 2008/0193859 A1 | 8/2008 | Hamouda |
| 2008/0248412 A1 | 10/2008 | Stuber et al. |
| 2008/0263483 A1 | 10/2008 | Koike et al. |
| 2009/0030636 A1 | 1/2009 | Pan et al. |
| 2009/0144691 A1 | 6/2009 | Rathsack et al. |
| 2009/0148783 A1 | 6/2009 | Socha |
| 2009/0199151 A1 | 8/2009 | Banerjee et al. |
| 2010/0115486 A1 | 5/2010 | Barnes et al. |
| 2010/0122231 A1 | 5/2010 | Agarwal et al. |
| 2010/0180251 A1 | 7/2010 | Ye et al. |
| 2010/0269079 A1 | 10/2010 | Banerjee et al. |
| 2010/0333049 A1 | 12/2010 | Agarwal et al. |
| 2011/0119642 A1 | 5/2011 | Agarwal et al. |
| 2011/0124193 A1 | 5/2011 | Cheng et al. |
| 2011/0138342 A1 | 6/2011 | Agarwal |
| 2011/0145770 A1 | 6/2011 | Brooks et al. |
| 2011/0150343 A1 | 6/2011 | Agarwal et al. |
| 2011/0179391 A1* | 7/2011 | Culp et al. ............... 716/50 |
| 2011/0202892 A1* | 8/2011 | Lee et al. ............... 716/53 |
| 2011/0271238 A1 | 11/2011 | Mansfield et al. |

OTHER PUBLICATIONS

U.S. Appl. No. 12/492,301. 3 pages.
U.S. Appl. No. 12/619,742, 2 pages.
U.S. Appl. No. 12/630,216, 3 pages.
U.S. Appl. No. 12/645,627, 2 pages.
U.S. Appl. No. 12/770,791, 1 page.
U.S. Appl. No. 12/856,208, 2 pages.
Banerjee, S et al., "Compensating non-optical effects using electrically driven optical proximity correction", Proceedings of the SPIE—The International Society for Optical Engineering, vol. 7275, 2009, Design for Manufacturability through Design-Process Integration III Conference, Feb. 26-27, 2009, Abstract only, 1 page.
Bruce, James A. et al., "Model-Based Verification for First Time Right Manufacturing", Proceedings of SPIE, vol. 5756, 2005, pp. 198-207.
Cao, KE et al., "Standard Cell Characterization Considering Lithography Induced Variations", Design Automation Conference, 2006 43rd ACM/IEEE, pp. 801-804.
Cobb, Nick et al., "Fast Sparse Aerial Image Calculation for OPC", Proceedings of SPIE, vol. 2621, 1995, pp. 534-545.
Cobb, Nick , "Flexible sparse and dense OPC algorithms", Proceedings of SPIE, vol. 5853, 2005, pp. 693-702.
Cobb, Nick et al., "Mathematical and CAD Framework for Proximity Correction", Proceedings of SPIE, vol. 2726, Jun. 1996, pp. 208-222.
Cobb, Nick et al., "Model-based OPC using the MEEF matrix", Proceedings of SPIE, vol. 4889, 2002, pp. 1281-1292.
Cobb, Nick et al., "Using OPC to optimize for image slope and improve process window", Proceedings of SPIE, vol. 5130, 2003, pp. 838-846.
Heloue, Khaled R. et al., "Early Analysis and Budgeting of Margins and Corners Using Two-Sided Analytical Yield Models", Computer-Aided Design of Integrated Circuits and Systems, IEEE Transactions on vol. 27, Issue 10, Oct. 2008, pp. 1826-1839.
Hsiao, Chia-Chi et al., "On Distinguishing Process Corners for Yield Enhancement in Memory Compiler Generated SRAM", Memory Technology, Design, and Testing, 2009. MTDT 2009. IEEE International Workshop on; Aug. 31-Sep. 2, 2009, pp. 83-87.
Kawashima, Shinichi et al., "Implementation Requirements for Edge Exclusion Area Reduction for Maximized Output of Chips from a 200mm Wafer", Semiconductor Manufacturing, 2000, Proceedings of ISSM 2000. The Ninth International Symposium on; Sep. 26-28, 2000, pp. 98-101.
Kobayashi, Sachiko et al., "Automated hot-spot fixing system applied for metal layers of 65-nm logic devices", J. Micro/Nanolith, MEMS MOEMS, vol. 6(3), Jul.-Sep 2007, 6 pages.
Koike, K et al., "OPC to reduce variability of transistor properties", Proceedings of the SPIE—The International Society for Optical Engineering, vol. 6521, Design for Manufacturability through Design-Process Integration Conference, 28, Feb. 2007, Abstract only, 1 page.
Krasnoperova, Azalia et al., "Process Window OPC for Reduced Process Variability and Enhanced Yield", Proceedings of SPIE, vol. 6154, 2006, 12 pages.
Liebmann, Lars W. et al., "Optimizing Style Options for Sub-Resolution Assist Features", Proceedings of SPIE, vol. 4346, 2001, pp. 141-152.
Liebmann, Lars et al., "Reducing DfM to Practice: the Lithography Manufacturability Assessor", Proceedings of SPIE, vol. 6156, 2006, 12 pages.
Liu, Yong et al., "Optimal binary image design for optical lithography", Proceedings of SPIE, vol. 1264, 1990, pp. 401-412.
Mansfield, Scott et al., "Through-process modeling for design-for-manufacturability applications", J. Micro/Nanolith, MEMS MOEMS, vol. 6(3), Jul.-Sep. 2007, 9 pages.
Teh, Stew-Hong et al., "Device Performance-based OPC for Optimal Circuit Performance and Mask Cost Reduction", Proceedings of SPIE, vol. 6925, 692511, 2008, 8 pages.
Torres, J. A. et al., "Integrated Circuit DFM Framework for Deep Sub-Wavelength Processes", Proceedings of SPIE, vol. 5756, 2005, pp. 39-50.
Wong, K et al., "Development of new methodology and technique to accelerate region yield improvement", Advanced Semiconductor Manufacturing Conference and Workshop, 1998. 1998 IEEE/SEMI; Sep. 23-25, 1998, pp. 82-85.
Yang, Ellyn et al., "Model-Based Retarget for 45nm Node and Beyond", Proceedings of SPIE, vol. 7274, 2009, 8 pages.
Yu, Peng et al., "Process Variation Aware OPC with Variational Lithography Modeling", Design Automation Conference, 2006 43rd ACM/IEEE, pp. 785-790.

* cited by examiner

NL – PULL-DOWN NFET DEVICE
PL – PULL-UP PFET DEVICE
AL – ACCESS NFET DEVICE

RETARGETING FOR ELECTRICAL YIELD ENHANCEMENT

BACKGROUND

The present application relates generally to an improved data processing apparatus and method and more specifically to an apparatus and method for layout retargeting for electrical yield enhancement.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

The resolution of the photo-lithography system (R) can be described by the well-known Rayleigh's equation:

$$R = \frac{k_1 \lambda}{NA}$$

in which $\lambda$ is the wavelength of the light source, NA is the numerical aperture, and $k_1$ is the factor describing the complexity of resolution enhancement techniques. As the very-large-scale integration (VLSI) technology pushes further into nanometer region, the feasible wavelength of the photo-lithographic system remains unchanged at 193 nm. Although there is anticipation that extreme ultraviolet lithography (EUVL) with the wavelength of 13 nm will replace traditional optical lithography, the availability of EUVL remains uncertain due to technical challenges and cost issues. On the other hand, the physical limit of dry lithography of NA is 1.0. The recently introduced immersion lithography has bigger NA (1.2), but it is harder to further increase NA to even higher values. Thus it is commonly recognized that $k_1$ remains a cost effective knob to achieve finer resolution.

Due to the unavoidable diffraction, the optical lithography system is lossy in the sense that only low frequency components of the electromagnetic field can pass the optical system. As the gap between the required feature size and lithography wavelength gets bigger, the final wafer images are quite different from the patterns on the mask. In the past few years, resolution enhancement techniques (RETs) have become necessary in order to achieve the required pattern density. One well-known RET is the optical proximity correction (OPC), in which the mask patterns are intentionally "distorted" so that the desired image can be formed on the wafer. Other commonly used RETs are sub-wavelength resolution assist features (SRAF) and phase-shift masks (PSM). Nowadays, considerable amount of computing power has to be dedicated to these post-layout processes (often referred as data prep). Large computer farms have to spend weeks of central processing unit (CPU) time to perform data prep after a design is completed. As the technology is further pushed, manufacturing variations (e.g., dose and focus variations during the lithograph steps) have to be considered.

Lithographic variation in parameters such as exposure dose, focus, mask error, overlay, etc. may cause significant deviation in the printed wafer image from the desired target layout. The response of a layout feature to lithographic sources of variation is typically represented by process variability band (PV-band). PV-bands represent the geometric variation in the printed wafer image contours over desired process window. These bands are generated by aerial image simulations on post Optical Proximity Correction (OPC) mask pattern at different process window corners. The resulting aerial image contours for different corners are combined together to generate inner (minimum) and outer (maximum) limits on the printed wafer contours. PV-bands represent the geometric region between these outer and inner contours indicating that the printed wafer image can lie anywhere between these two physical extremes due to lithographic variability. Besides impacting manufacturing yield, PV-bands may also degrade parametric yield by impacting the electrical behavior of a circuit.

SUMMARY

In one illustrative embodiment, a method, in a data processing system, is provided for electrical yield enhancement retargeting of photolithographic layouts. The illustrative embodiment performs optical proximity correction on a set of target patterns in order to produce a set of optical proximity correction mask shapes. The illustrative embodiment generates a set of lithographic contours for each of the set of optical proximity correction mask shapes. The illustrative embodiment determines electrical yield sensitivities for at least one shape in a set of shapes in the set of target patterns. The illustrative embodiment determines an amount and a direction of retargeting for each of the at least one shape in the set of shapes based on the electrical yield sensitivity of the shape. The illustrative embodiment generates a new set of target patterns with retargeted edges for each shape in the at least one shape based on the amount and the direction of retargeting.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

While current optical proximity correction (OPC) methods in a lithographic process are intended to optimize masks to improve image fidelity at nominal process condition, they can not guarantee pattern fidelity across lithographic dose and focus variation. Lithographic variations (in dose, focus, etc.) may degrade image quality across process window. The impact of lithographic variation on a printed image appears in the form of process variability bands (PV-bands) for each edge. PV-bands for an edge depend on the sensitivity of the edge to dose and focus. For example, the printed linewidth varies linearly with exposure and non-linearly with defocus. PV-bands are typically used for lithographic process window assessment. PV-band may also impact electrical characteristics of shapes of devices and thus cause electrical yield degradation for critical circuits and devices, such as Static Random Access Memory (SRAM), latches, or the like. Hence, it is important to consider the impact of PV-band on electrical yield and develop solutions that can maximize electrical yield under lithographic variation.

Figure 1:
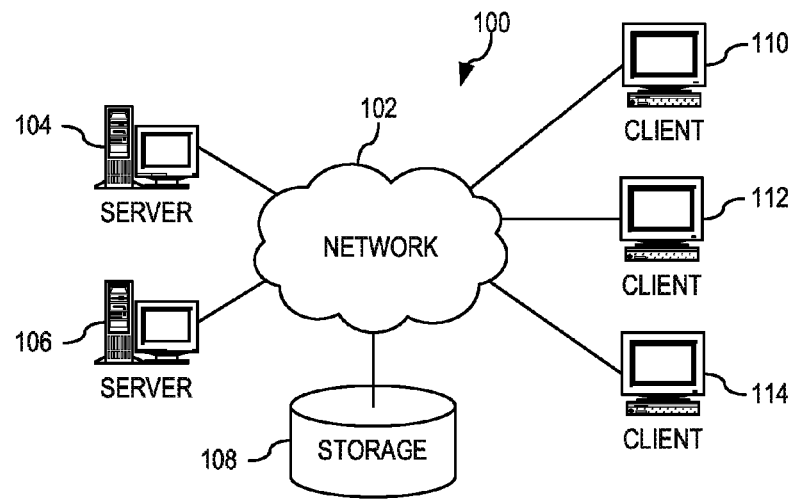
FIG. 1 depicts a pictorial representation of an example distributed data processing system in which aspects of the illustrative embodiments may be implemented.
Figure 2:
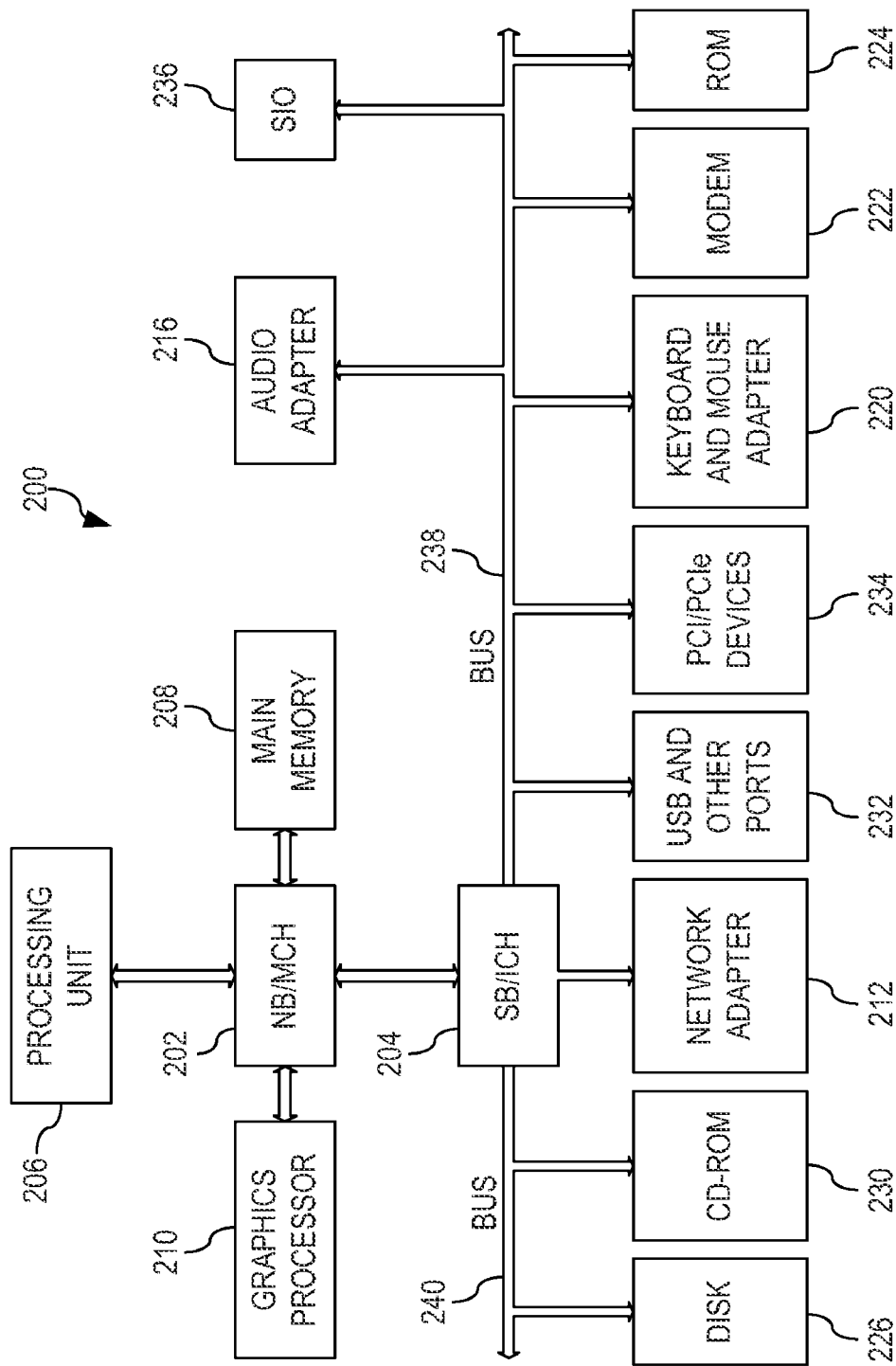
FIG. 2 shows a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments. FIGS. 1 and 2 are provided hereafter as example environments in which aspects of the illustrative embodiments may be implemented. While the description following FIGS. 1 and 2 will focus primarily on a single data processing device implementation of a mechanism that provides retargeting for electrical yield enhancement, this is only an example and is not intended to state or imply any limitation with regard to the features of the present invention. To the contrary, the illustrative embodiments are intended to include distributed data processing environments and embodiments in which retargeting may be performed for electrical yield enhancement.

With reference now to the figures and in particular with reference to FIGS. 1-2, example diagrams of data processing environments are provided in which illustrative embodiments of the present invention may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of. International Business Machines Corporation in the United States, other countries, or both while LINUX is a trademark of Linus Torvulds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded lath main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

Figure 3:
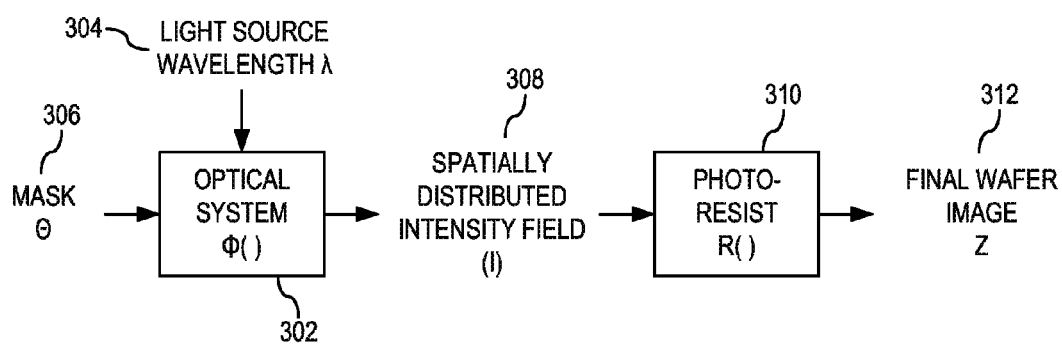
FIG. 3 illustrates a highly simplified schematic view of a state-of-the-art optical lithography process.

FIG. 3 illustrates a highly simplified schematic view of a state-of-the-art optical lithography process. In optical system ($\Phi(\ )$) 302, light source 304 of wavelength $\lambda$ projects through received mask ($\Theta$) 306 to achieve a spatially distributed intensity field (I) 308 on the wafer source. After chemical reactions of photo-resist (R( )) 310 on the wafer source, final wafer image (Z) 312 forms on the wafer source.

As discussed above, process variability bands (PV-bands) may cause electrical yield degradation for critical circuits and devices, such as static random access memory (SRAM), latches, or the like. While the illustrative embodiments are directed to enhancing the electrical yield of all circuits and devices printed using the lithographic process, such as SRAMs, latches, or the like, the following description is directed to a single SRAM cell as one example and is not intended to limit the invention to any one type of circuit. That is, the illustrative embodiments provide retargeting to enhance the electrical yield of any circuit printed using the lithographic process.

In the exemplary illustrative embodiment, an SRAM cell may fail in multiple ways, such as read disturb fail, read access fail, write fail, or the like. Variations in different shapes of devices in an SRAM cell may contribute differently to electrical yield and variation in each shape of a device in an SRAM cell may also contribute differently to the various failure modes. When different SRAM fail modes and corresponding sensitivities to lithographic variation are considered together, the overall (joint) yield degradation with variation is strongly non-linear and asymmetric. For example, an increase in the polysilicon conductor (PC) length for an access device may impact yield more severely than a similar decrease in the length of the device. Furthermore, the nature and magnitude of the asymmetry is different for different devices.

Figure 4A:
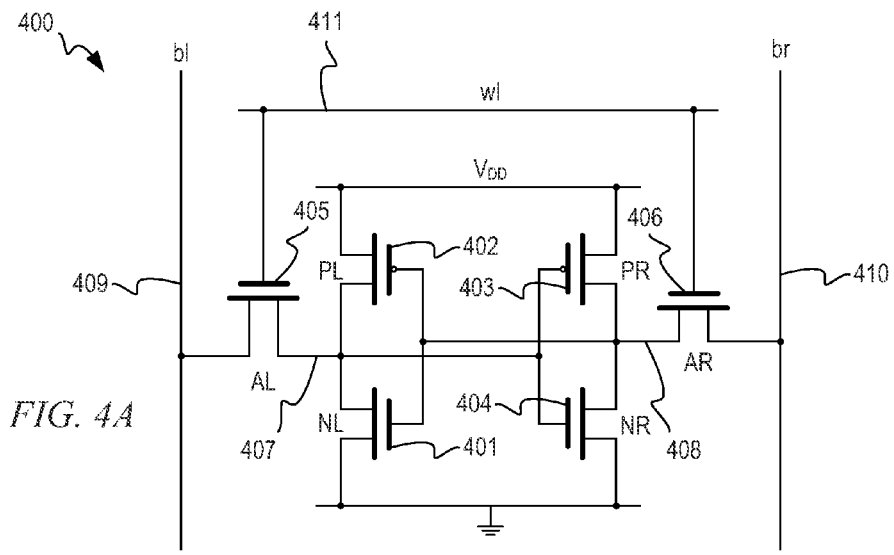
FIG. 4A depicts an example of a typical memory cell in accordance with an illustrative embodiment.

FIG. 4A depicts an example of a typical memory cell in accordance with an illustrative embodiment. Memory cell 400 forms the basis for most static random-access memories in CMOS technology. Memory cell 400 uses six transistors 401-406 to store and access one bit. Transistors 401-404 in the center form two cross-coupled inverters. Due to the feedback structure created by transistors 401-404, a low input value on transistors 402 and 403 will generate a high value on transistors 401 and 404, which amplifies (and stores) the low value on transistors 401 and 404. Similarly, a high input value on transistors 402 and 403 will generate a low input value on transistors 401 and 404, which feeds back the low input value onto transistors 403 and 404. Therefore, transistors 401-404 will store their current logical value, whatever value that is.

Lines 407 and 408 between transistors 401-404 are connected to separate bitlines 409 and 410 via two n-channel pass-transistors 405 and 406. The gates of transistors 405 and 406 are driven by wordline 411. In a memory array wordline 411 is used to address and enable all bits of one memory word. As long as wordline 411 is kept low, memory cell 400 is disconnected from bitlines 409 and 410. Transistors 401-404 keep feeding themselves and memory cell 400 stores its current value.

When wordline 411 is high, both transistors 405 and 406 are conducting and connect the inputs and outputs of transistors 401-404 to bitlines 409 and 410. That is, transistors 401-404 drive the current data value stored inside the memory cell 400 onto bitline 409 and the inverted data value on inverted bitline 410. This data may then be amplified by a bitline evaluator and generates the output value of memory cell 400 during a read operation. To write new data into memory cell 400, wordline 411 is activated and, depending on the current value stored inside memory cell 400, there might be a short-circuit condition and the value inside memory cell 400 is literally overwritten. This only works because transistors 401-404 are very weak.

Figure 4B:
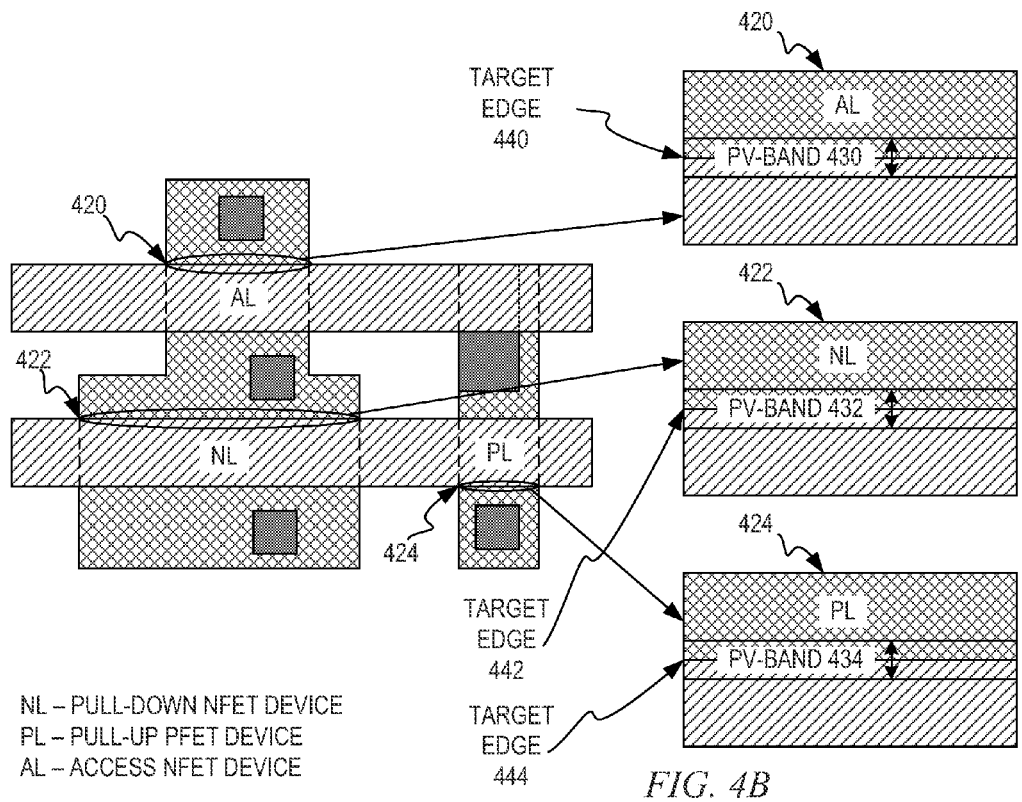
FIG. 4B depicts polysilicon conductor (PC) PV-bands generated through OPC and aerial image simulations across dose and focus variation for half of a static random access memory (SRAM) cell in accordance with an illustrative embodiment.

FIG. 4B depicts polysilicon conductor (PC) PV-bands generated through optical proximity correction (OPC) and aerial image simulations across dose and focus variation for half of a static random access memory (SRAM) cell in accordance with an illustrative embodiment. In FIG. 4B, regular restrictive design rules (RDRs) show fairly similar process variability (PV) bands 430, 432, and 434 across target edges 440, 442, and 444 for access negative channel field effect transistor (NFET) device (AL) 420, pull-down NFET device (NL) 422, and pull-up positive channel field effect transistor (PFET) device (PL) 424, respectively. Access NFET device (AL) 420, pull-down NFET device (NL) 422, and pull-up PFET device (PL) 424 show one-implementation of forming transistors such as transistors 405, 401 and 402, of FIG. 4A, respectively. While FIG. 4B illustrates only access NFET device (AL) 420, pull-down NFET device (NL) 422, and pull-up PFET device (PL) 424, the relative positioning of the conventional PV-bands with respect to target edges may be similar for other devices that may be formed using a photolithographic process.

An SRAM cell may fail in multiple ways such as read disturb, read access, and write fails. Different fail modes dominate in different regions of variation which may delimit overall electrical yield. The effective impact of variation in dose, focus, or the like, during the photolithographic process may cause edges of the formed shapes of the devices to print smaller or larger, thereby causing different electrical failures that in turn cause an impact to the electrical yield of the device. The electrical yield may be defined as fraction of working chips for which a plurality of electrical metrics are satisfied within a predetermined threshold. The electrical yield may further be defined as a parametric yield for parameters such as timing, leakage, or the like, and functional yield for parameters such as read, write, read disturb, or the like.

Figure 5B:
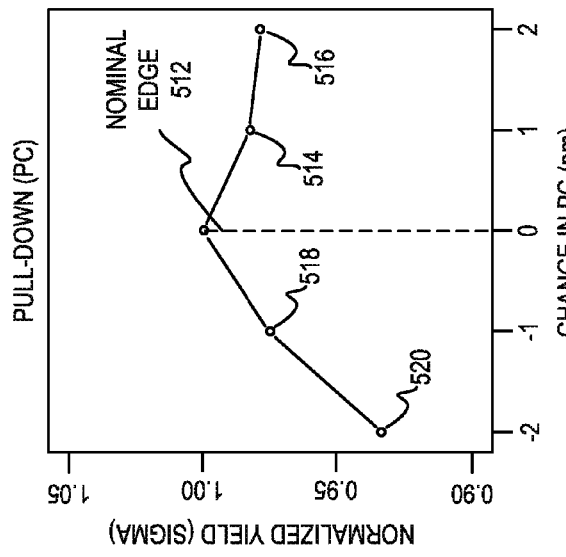
FIGS. 5A-5C illustrate an effective impact of variation on overall electrical yield sensitivity of various devices by using a piecewise combination of worst case fail modes that are yield delimiting in accordance with an illustrative embodiment.
Figure 5C:
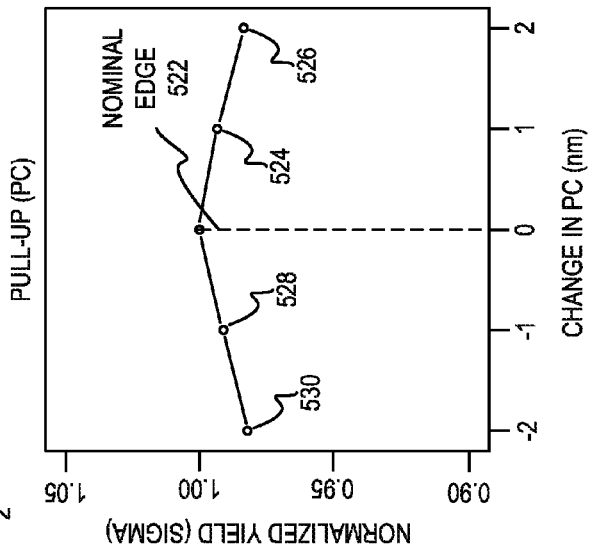
Figure 5A:
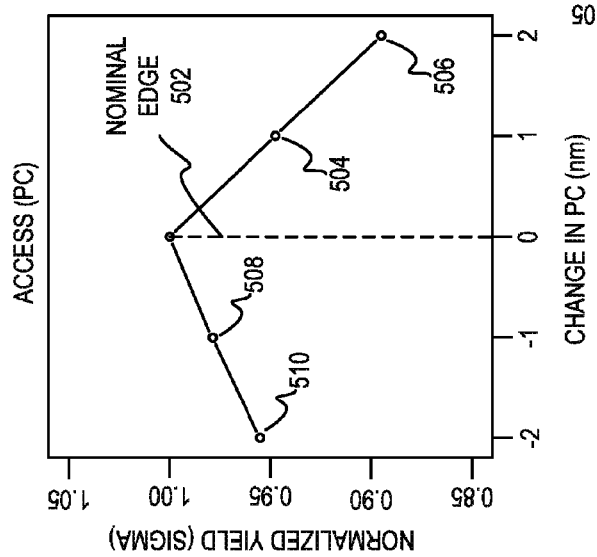

FIG. 5A-5C illustrate an effective impact of variation on overall electrical yield for various devices by using a piecewise combination of worst case fail modes that are yield delimiting in accordance with an illustrative embodiment. FIGS. 5A-5C depict that yield response with respect to variation in the three devices is piecewise linear and degrades asymmetrically with positive and negative variation. The asymmetry exists because different fail modes dominate yield for positive and negative variation. For example, for the access device, the read disturb fail may dominate yield for negative variation and read access fail may limit overall yield for positive variation.

FIG. 5A depicts a normalized yield versus a change in polysilicon conductor width or variation in gate length from nominal length in an access negative channel field effect transistor (NFET) device (AL), such as access NFET device (AL) 420 of FIG. 4B. In FIG. 5A, the normalized yield at nominal edge 502 is 1. However when printed line width is higher by positive one nanometer 504 the normalized yield is shown to have dropped to approximately 0.95 and at a change in line width of positive two nanometers 506 the normalized yield is shown to have dropped to approximately 0.90. At a change in line width of negative one nanometer 508 the normalized yield is shown to have dropped to approximately 0.97 and at a change in line width of negative two nanometers 510 the normalized yield is shown to have dropped to approximately 0.95.

FIG. 5B depicts a normalized yield versus a change in polysilicon conductor or variation at various distances from a nominal edge in an pull-down negative channel field effect transistor (NFET) device (NL), such as pull-down NFET device (NL) 422 of FIG. 4B. In FIG. 5B, the normalized yield at nominal edge 512 is 1. However at a change in line width of positive one nanometer 514 the normalized yield is shown to have dropped to approximately 0.98 and at a change in line width of positive two nanometers 516 the normalized yield is shown to have dropped to approximately 0.97. At a change in line width of negative one nanometer 518 the normalized yield is shown to have dropped to approximately 0.97 and at a change in line width of negative two nanometers 520 the normalized yield is shown to have dropped to approximately 0.93.

FIG. 5C depicts a normalized yield versus a change in polysilicon conductor or variation at various distances from a nominal edge in a pull-up positive channel field effect transistor (PFET) device (PL), such as pull-up PFET device (PL) 424 of FIG. 4B. In FIG. 5C, the normalized yield at nominal edge 522 is 1. However at a change in line width of positive one nanometer 524 the normalized yield is shown to have dropped to approximately 0.98 and at a change in line width of positive two nanometers 526 the normalized yield is shown to have dropped to approximately 0.97. At a change in line width of negative one nanometer 528 the normalized yield is shown to have dropped to approximately 0.98 and at a change in line width of negative two nanometers 530 the normalized yield is shown to have dropped to approximately 0.97.

Figure 6B:
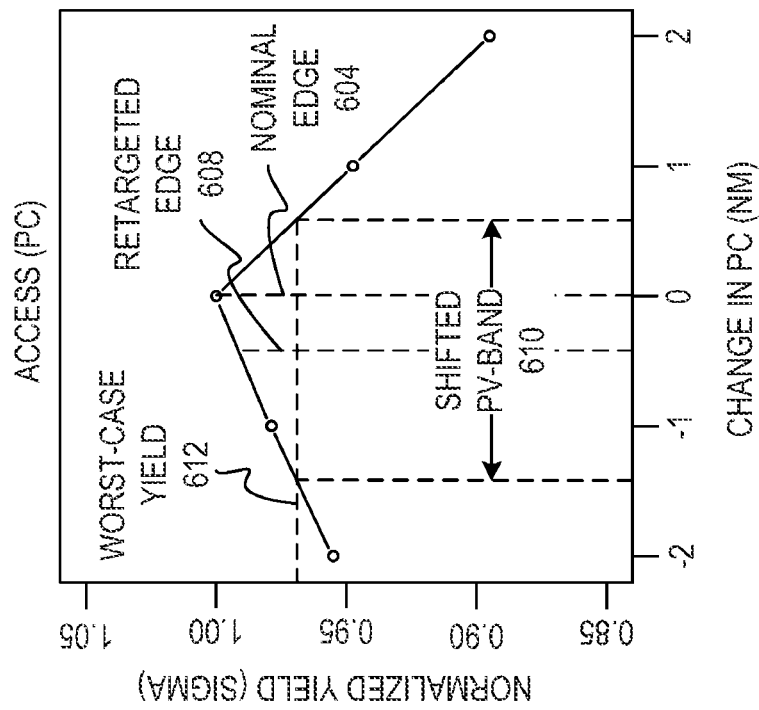
FIG. 6B shows an example of optimally shifting the PV-bands via retargeting in accordance with an illustrative embodiment.
Figure 6A:
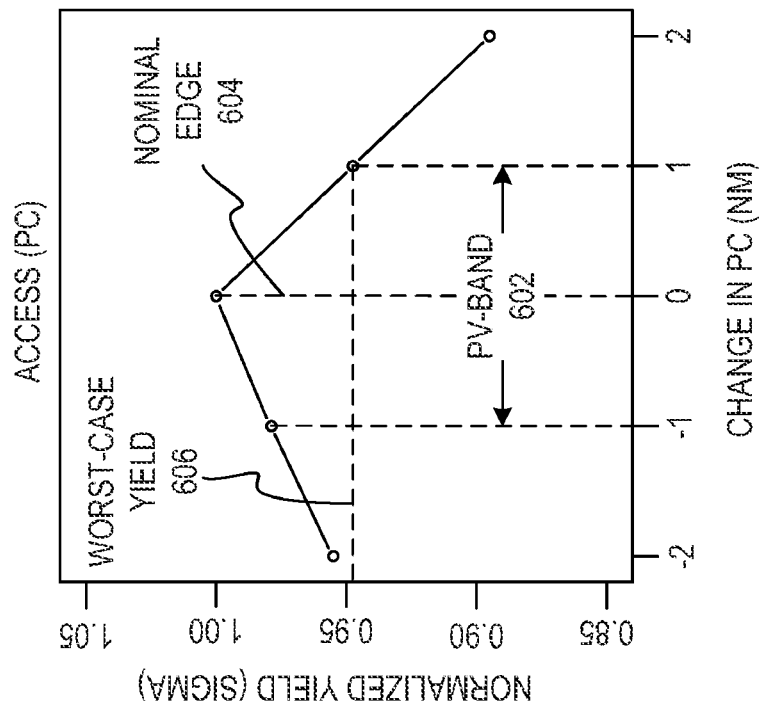
FIG. 6A depicts a worst-case yield for variation in various devices in accordance with an illustrative embodiment.

Thus, as is shown in FIGS. 5A-5C the asymmetric nature of yield versus variation results in a sub-optimal yield for a given range of variation. FIG. 6A depicts a worst-case yield for variation in an access negative channel field effect transistor (NFET) device (AL), such as access NFET device (AL) 420 of FIG. 4B in accordance with an illustrative embodiment. In FIG. 6A, for a given process variability (PV) band 602, such as the exemplary depicted range of variation −1 to 1 nanometers from nominal edge 604, the worst-case yield 606 is just below 0.95. However, the electrical yield for the same range of variation (−1, 1) may be improved by optimally shifting the PV-bands via retargeting as is shown in FIG. 6B in accordance with an illustrative embodiment. In FIG. 6B, retargeted edge 608 has been moved −0.4 nanometers from nominal edge 604 and shifted PV-band 610 now ranges from −1.4 to 0.6 nanometers. By optimally shifting nominal edge 604 to retargeted edge 608, the worst-case yield 612 has been improved to 0.97. While in these examples, the range of the PV-band is randomly chosen as −1 to +1 nm, in reality, the PV-band may be wider or smaller. Thus, while the retargeting numbers in this example are very small, when a wider PV-band is used, such as −3 nm to +3 nm, the yield values may be higher and thus the retargeting edge may move a greater distance based on the calculated optimal retargeting value r.

Figure 7:
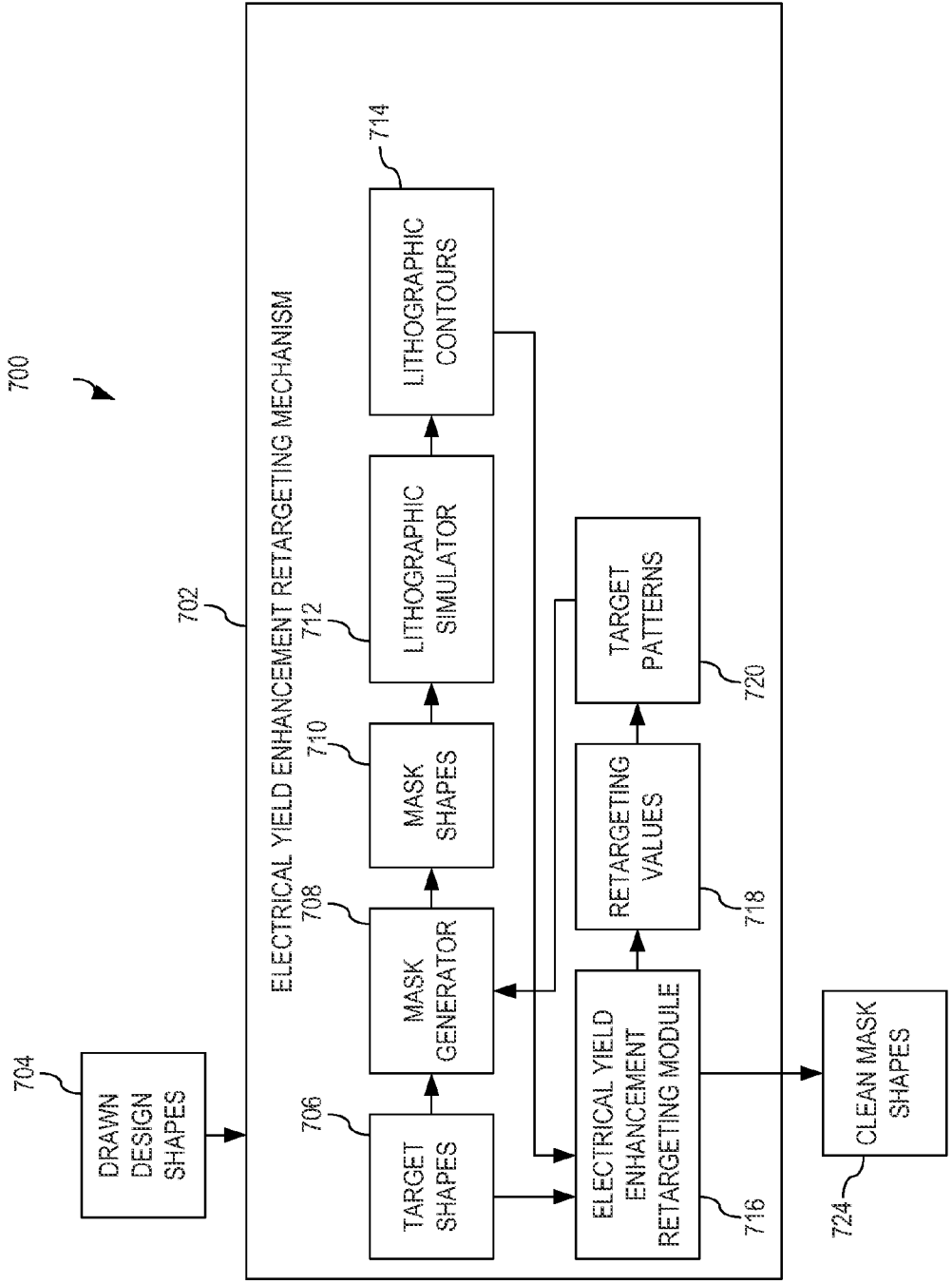
FIG. 7 depicts a block diagram of a electrical yield enhancement retargeting mechanism for photolithographic layouts in accordance with an illustrative embodiment.

FIG. 7 depicts a block diagram of a electrical yield enhancement retargeting mechanism for photolithographic layouts in accordance with an illustrative embodiment. Electrical yield enhancement retargeting mechanism 702 in data processing system 700 initially receives drawn design shapes 704 from a designer. Electrical yield enhancement retargeting mechanism 702 uses drawn design shapes 704 as initial target shapes 706. Mask generator 708 then generates initial mask shapes 710 through optical proximity correction (OPC). Lithographic simulator 712 then performs simulations using initial mask shapes 710 and produces lithographic contours and/or PV-bands 714 for different edges in the layout of initial mask shapes 710.

Electrical yield enhancement retargeting module 716 initially identifies all of the electrically critical layers in target shapes 706 needed for electrically yield driven retargeting. Electrical yield enhancement retargeting module 716 generates a circuit netlist with circuit connectivity and component parameters for Simulation Program with Integrated Circuit Emphasis (SPICE) simulation of the electrical yield. The circuit simulation on the circuit netlist varies electrically critical layers in target shapes 706 and determines the electrical yield sensitivities of the various edges in target shapes 706. Using the electrical yield sensitivities and lithographic contours 714, electrical yield enhancement retargeting module 716 calculates an optimal amount and direction of retargeting 718, which may be referred to as an optimal retargeting value r, for each device or shape in target shapes 706. That is, for a given range of variation ΔL, which is illustrated as (−a,a), an optimal retargeting value r for each electrically critical shape may be calculated that shifts the process variability (PV) bands such that the electrical yield impact due to variation in both directions is equal. This calculation is further detailed in FIG. 8.

Once an optimal retargeting value r 718 is obtained for each shape, electrical yield enhancement retargeting module 716 generates new target patterns 720 with retargeted edges for each of the shapes. At this point, mask generator 708 then generates new mask shapes 710 through optical proximity correction (OPC) on the new target patterns 720. Lithographic simulator 712 then performs simulations using new mask shapes and produces lithographic contours and/or PV-bands 714 for different edges in the layout. With the new target patterns and corresponding lithographic contours, electrical yield enhancement retargeting module 716 determines whether all electrical constraints have been satisfied. If so, the electrical yield enhancement retargeting mechanism 702 produces clean mask shapes 724.

If need be, the process of retargeting and PV-band generation may be repeated several times until the electrical metrics are satisfied within a predetermined threshold or the iterations meet the maximum predetermined number of iterations. That is, the illustrative embodiment may perform OPC and lithographic simulations to obtain the PV-band in the beginning, retarget, do OPC and lithographic simulations to obtain new PV-band and repeat the process until all electrical constraints are satisfied or maximum number of iterations are reached. Additionally, the process may only be used once to perform OPC and lithographic simulation to obtain a first set of PV-band values, perform retargeting based on the first set of PV-band values and electrical sensitivity, and perform OPC and lithographic simulations to obtain a second set of PV-band values for verification. Thus, in most practical cases, only one round of retargeting would be sufficient to maximize electrical yield under lithographic variation.

Thus, electrical yield enhancement retargeting module 716 modifies target shapes 706 provided by the designer to generate new target shapes that have optimal electrical yield. Electrical yield enhancement retargeting module 716 may improve electrical yield for critical circuits and devices, such as Static Random Access Memory (SRAM), latches, or the like.

Figure 8:
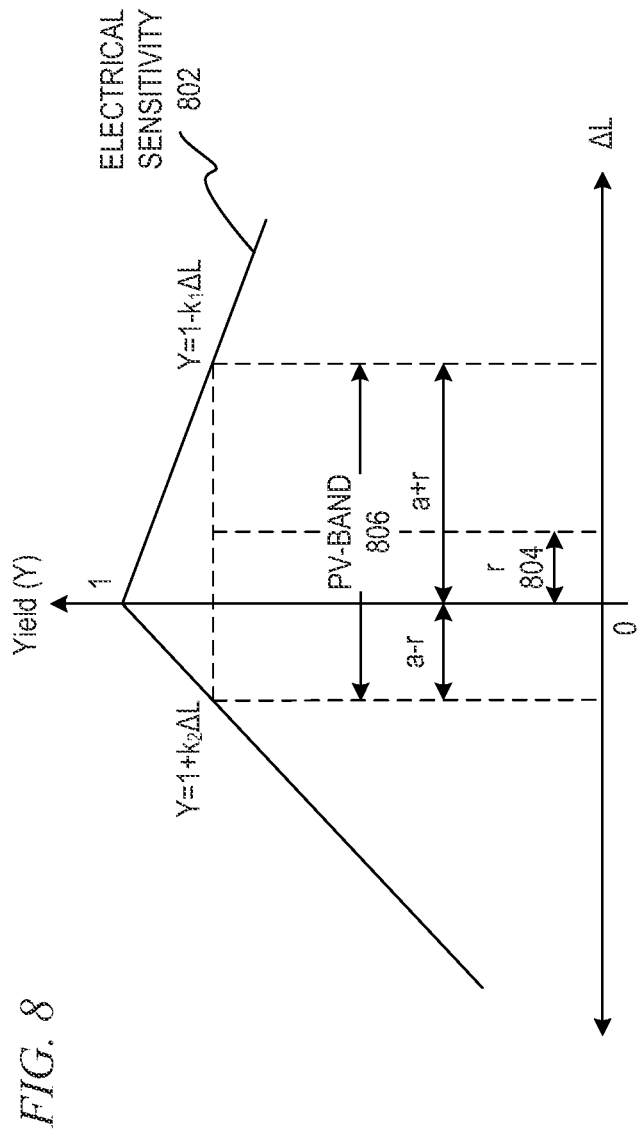
FIG. 8 illustrates an example of the calculations performed to optimize the amount and direction of retargeting from the electrical yield in accordance with an illustrative embodiment.

FIG. 8 illustrates an example of the calculations performed to optimize the amount and direction of retargeting from the electrical yield in accordance with an illustrative embodiment. In FIG. 8, for a given electrical yield sensitivity 802, a electrical yield enhancement retargeting module calculates a slope $k_1$ for the right or positive side and a slope $k_2$ for the left or negative side. Thus the yield response value for the right side becomes a function of $k_1$ which is expressed as $Y=1-k_1\Delta L$ and the yield response value for the left side becomes a function of $k_2$ which is expressed as $Y=1+k_2\Delta L$. In order to determine the optimal retargeting value r 804 that provides, and optimal amount and direction of retargeting, the yield response values are set equal to each other such that:

$$1+k_2\Delta L=1-k_1\Delta L$$

Since ΔL is the expected range of variation from −a to a and the retargeting value r will move −a and a by some optimal retargeting value r, then the equations may be rewritten as:

$$1+k_2(-a+r)=1-k_1(a+r)$$

Where −a is the negative distance away from the initial edge associated with the negative lithographic variation in the device, $k_2$ is a slope associated with the minimum yield of the device and the yield at the negative distance away from the initial yield, where a is the positive distance away from the initial edge associated with the positive lithographic variation in the device, where $k_1$ is a slope associated with the minimum yield of the device and the yield at the positive distance away from the initial yield, and where r is the retargeting value. Solving for the optimal retargeting value r, the following equation is derived:

$$r = \frac{(k_2 - k_1)}{(k_2 + k_1)}a$$

The optimal retargeting value r, which is the retargeted edge location, is the value that the nominal edge needs to move such that the electrical yield is optimized and the process variability (PV) band 806 ranges from a−r to a+r. While the PV-band may be asymmetric say $-a_1$ to $+a_2$, yield response may be non-linear. However, the illustrative embodiments may still obtain retargeting value r by equating the yield on the two sides.

Based on FIG. 8, a linear programming formulation that optimizes the worst case electrical yield across PV-band through layout retargeting may be written. Considering a circuit with N electrical yield constraints ($Y_1$ to $Y_N$), a sensitivity of each yield term to critical dimension (CD) variation may be pre-characterized in each device in the circuit. For a circuit with M devices, each yield term $Y_i$ may then be written as:

$$Y_i = Y_{oi} + \sum_{j=1}^{M} \left[\frac{\partial Y_i}{\partial CD_j}\right] \Delta CD_j \quad \forall\, i = 1 \text{ to } N$$

Considering that the worst case yield always occurs at either the inner or the outer CD contours, the impact of PV-band on each yield term $Y_i$ may be characterized with the following two through process yield limits:

$$Y_i^I = Y_{oi} - \sum_{j=1}^{M} \left[\frac{\partial Y_i}{\partial CD_j}\right] PV_I$$

$$Y_i^O = Y_{oi} + \sum_{j=1}^{M} \left[\frac{\partial Y_i}{\partial CD_j}\right] PV_O$$

The worst case yield across PV-band may be enhanced by retargeting CD of various devices in the circuit. Denoting the retargeting value for device j by $r_j$, then the previous yield limits may be modified as:

$$Y_i^I = Y_{oi} - \sum_{j=1}^{M} \left[\frac{\partial Y_i}{\partial CD_j}\right] (PV_I - r_j)$$

$$Y_i^O = Y_{oi} + \sum_{j=1}^{M} \left[\frac{\partial Y_i}{\partial CD_j}\right] (PV_O + r_j)$$

The retargeting values may then be obtained by solving the following linear program that maximizes worst case yield across lithographic process window.

$\text{Max}(Y_{WC})$ s.t.

$$Y_{oi} - \sum_{j=1}^{M} \left[\frac{\partial Y_i}{\partial CD_j}\right] (PV_I - r_j) \geq Y_{WC} \quad \forall\, i = 1 \text{ to } N$$

$$Y_{oi} + \sum_{j=1}^{M} \left[\frac{\partial Y_i}{\partial CD_j}\right] (PV_O + r_j) \geq Y_{WC} \quad \forall\, i = 1 \text{ to } N$$

$$l \leq r_j \leq u \quad \forall\, j = 1 \text{ to } M$$

Here $Y_{WC}$ is the worst-case yield across process window and l and u are the lower and upper limits on the amount of CD bias or retargeting that may be applied to each device in the circuit. The above framework may be easily applied to the SRAM example discussed above.

Figure 9B:
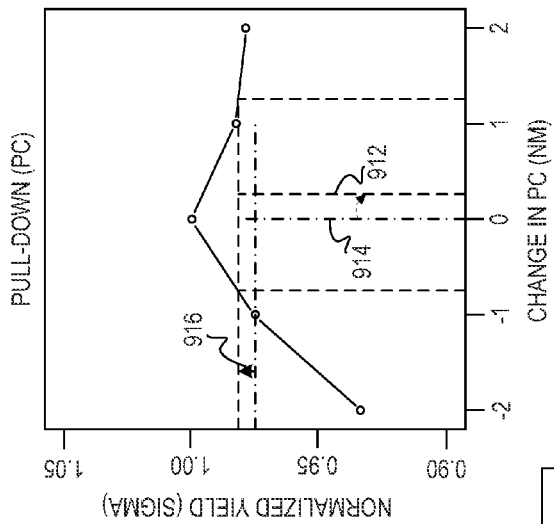
FIGS. 9A-9C illustrate the results of the electrically driven retargeting in accordance with an illustrative embodiment.
Figure 9C:
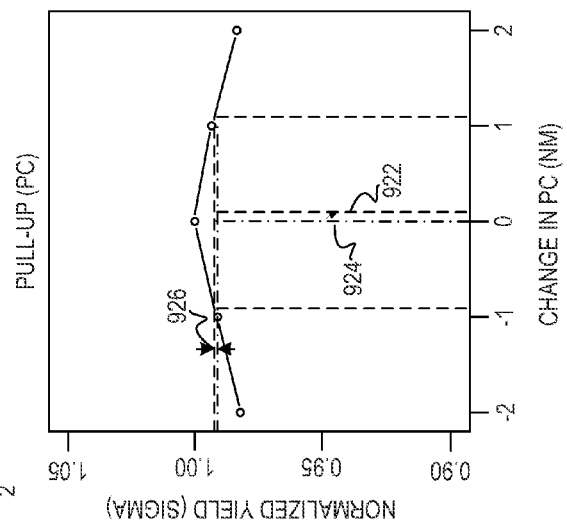
Figure 9A:
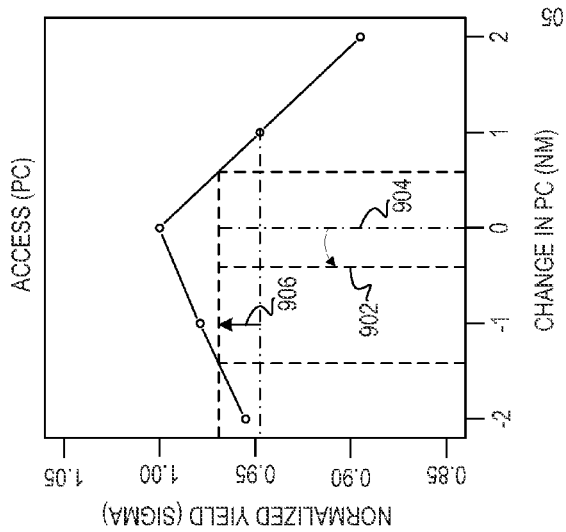

FIG. 9A-9C illustrate exemplary results of the electrically driven retargeting described in FIGS. 7 and 8 in accordance with an illustrative embodiment. FIG. 9A depicts retargeted edge 902, which is approximately −0.4 nanometers from the nominal edge 904, which resulted in an increased yield 906 of approximately 0.02. FIG. 9B depicts retargeted edge 912, which is approximately 0.3 nanometers from the nominal edge 914, which resulted in an increased yield 916 of approximately 0.012. FIG. 9C depicts retargeted edge 922, which is approximately 0.1 nanometers from the nominal edge 924, which resulted in an increased yield 926 of approximately 0.002. While in these examples, the range of the PV-band is randomly chosen as −1 to +1 nm, in reality, the PV-band may be wider or smaller. Thus, while the retargeting numbers in this example are very small, when a wider PV-band is used, such as −3 nm to +3 nm, the yield values may be higher and thus the retargeting edge may move a greater distance based on the calculated optimal retargeting value r.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 10:
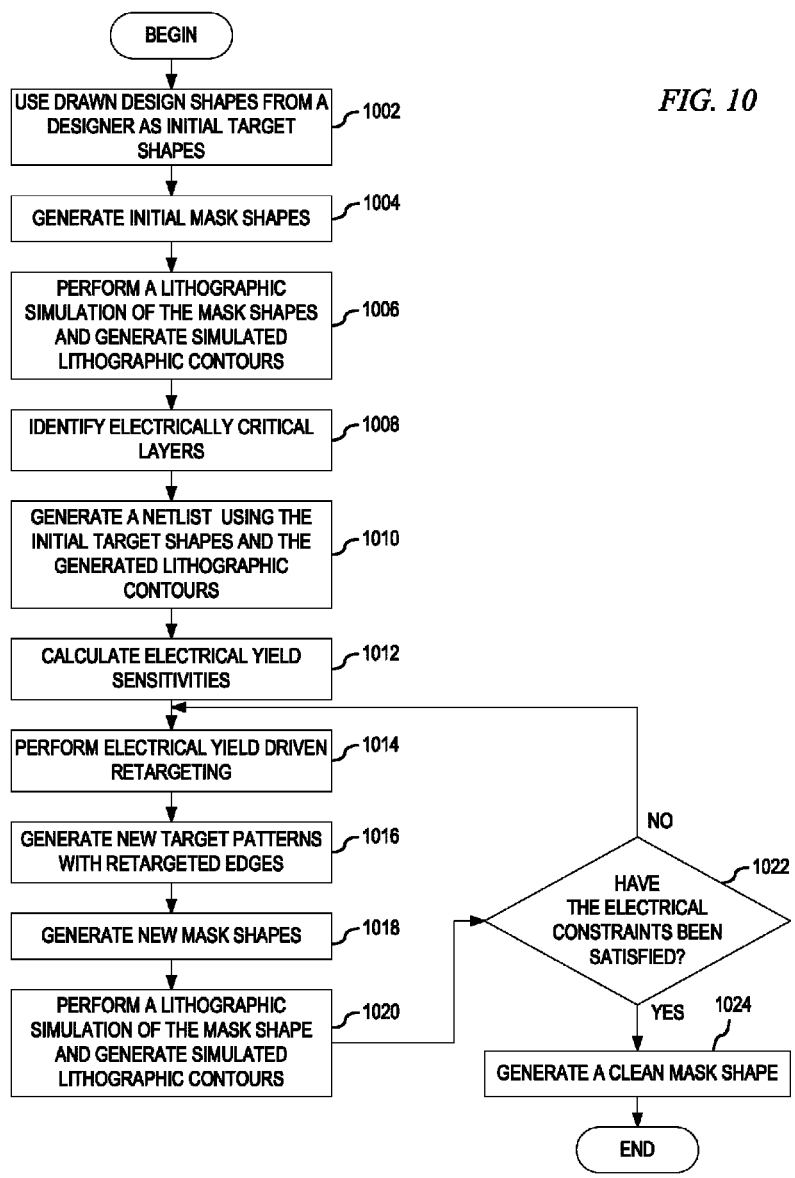
FIG. 10 provides a flowchart outlining example operations performed by an electrical yield enhancement retargeting mechanism in accordance with an illustrative embodiment.

Referring now to FIG. 10, this figure provides a flowchart outlining example operations performed by an electrical yield enhancement retargeting mechanism in accordance with an illustrative embodiment. As the operation begins, the electrical yield enhancement retargeting mechanism uses drawn design shapes from a designer as initial target shapes (step 1002). A mask generator generates initial mask shapes through optical proximity correction (OPC) (step 1004). A lithographic simulator performs simulations using the initial mask shapes and produces lithographic contours (step 1006).

A electrical yield enhancement retargeting module initially identifies all of the electrically critical layers in the target shapes needed for electrically yield driven retargeting (step 1008). The electrical yield enhancement retargeting module generates a circuit netlist using the electrically critical layers in the target shapes (step 1010). The electrical yield enhancement retargeting module then determines the electrical yield sensitivities of the various devices or shapes in the target shapes (step 1012). Using the electrical yield sensitivities, the electrical yield enhancement retargeting module calculates an optimal amount and direction of retargeting, which may be referred to as an optimal retargeting value r, from the electrical yield versus the variation sensitivities of each device or shape in the target shapes (step 1014).

Once an optimal retargeting value r is obtained for each device or shape, electrical yield enhancement retargeting module generates new target patterns with retargeted edges for each of the devices or shapes (step 1016). The mask generator generates new mask shapes through optical proximity correction on the new target patterns (step 1018). The lithographic simulator performs simulations using the new mask shapes and produces lithographic contours (step 1020).

With the new target patterns and corresponding lithographic contours, the electrical yield enhancement retargeting mechanism determines whether all electrical constraints have been satisfied (step 1022). If at step 1022 the electrical constraints have been satisfied, the electrical yield enhancement retargeting mechanism generates one or more clean mask shapes (step 1024), with the operation ending thereafter. If at step 1022 the electrical constraints have not been satisfied, then the operation may return to step 1014 for another iteration. As discussed above, the illustrative embodiment provide for performing the electrical yield enhancement retargeting a predetermined number of iterations as determined by an iteration counter, if provided.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, of combinations of special purpose hardware and computer instructions.

Thus, the illustrative embodiments provide a mechanism for enhancing the electrical yield of all circuits and devices printed using the lithographic process, such as SRAMS, latches, or the like. That is, the illustrative embodiments provide retargeting to enhance the electrical yield of any circuit printed using the lithographic process.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for electrical yield enhancement retargeting of photolithographic layouts, the method comprising:
    performing, by an electrical yield enhancement retargeting mechanism in the data processing system, optical proximity correction on a set of target patterns in order to produce a set of optical proximity correction mask shapes;
    generating, by the electrical yield enhancement retargeting mechanism, a set of lithographic contours for each of the set of optical proximity correction mask shapes;
    determining, by the electrical yield enhancement retargeting mechanism, electrical yield sensitivities for at least one shape in a set of shapes in the set of target patterns;
    determining, by the electrical yield enhancement retargeting mechanism, an amount and a direction of retargeting for each shape in the set of shapes based on the electrical yield sensitivity of the shape;
    generating, by the electrical yield enhancement retargeting mechanism, a new set of target patterns with retargeted edges for each shape based on the amount and the direction of retargeting;
    determining, by the electrical yield enhancement retargeting mechanism, whether the new set of target patterns with retargeted edges satisfies all electrical constraints; and
    responsive to the new set of target patterns satisfying all electrical constraints associated with an initial set of target patterns, generating, by the electrical yield enhancement retargeting mechanism, a set of clean mask shapes.

2. The method of claim 1, wherein the electrical yield sensitivity of each shape in the set of shapes is determined by:
    generating, by the electrical yield enhancement retargeting mechanism, a circuit netlist that comprises at least one of circuit connectivity or component parameters; and
    performing, by the electrical yield enhancement retargeting mechanism, circuit simulations on the circuit netlist.

3. The method of claim 2, further comprising:
    varying, by the electrical yield enhancement retargeting mechanism, electrically critical layers in the set of target patterns in order to determine the electrical yield sensitivity of each shape in the set of shapes.

4. The method of claim 1, further comprising:
    responsive to the new set of target patterns failing to satisfying all electrical constraints associated with the initial set of target patterns, determining, by the electrical yield enhancement retargeting mechanism, a new amount and a new direction of retargeting for each of the at least one shape in the set of shapes based on the electrical yield sensitivity of the shape; and
    generating, by the electrical yield enhancement retargeting mechanism, another new set of target patterns with retargeted edges for each shape in the at least one shape based on the new amount and the new direction of retargeting.

5. The method of claim 1, wherein the at least one shape in the set of shapes is at least one of a component of a static random access memory (SRAM) or a component of a latch.

6. A computer program product for electrical yield enhancement retargeting of photolithographic layouts comprising a computer readable storage medium having a computer readable program stored therein, wherein the computer readable program, when executed on a computing device, causes the computing device to:
    perform optical proximity correction on a set of target patterns in order to produce a set of optical proximity correction mask shapes;
    generate a set of lithographic contours for each of the set of optical proximity correction mask shapes;
    determine electrical yield sensitivities for at east one shape in a set of shapes in the set of target patterns;
    determine an amount and a direction of retargeting for each shape in the set of shapes based on the electrical yield sensitivity of the shape;
    generate a new set of target patterns with retargeted edges for each shape based on the amount and the direction of retargeting;
    determine whether the new set of target patterns with retargeted edges satisfies all electrical constraints; and
    responsive to the new set of target patterns satisfying all electrical constraints associated with an initial set of target patterns, generate a set of clean mask shapes.

7. The computer program product of claim 6, wherein the electrical yield sensitivity of each shape in the set of shape is determined by the computer readable program, when executed on the computing device, causing the computing device to:
    generate a circuit netlist that comprises at least one of circuit connectivity or component parameters; and
    perform circuit simulations on the circuit netlist.

8. The computer program product of claim 7, wherein the computer readable program, when executed on the computing device, further causes the computing device to:
    vary electrically critical layers in the set of target patterns in order to determine the electrical yield sensitivity of each shape in the set of shapes.

9. The computer program product of claim 6, wherein the computer readable program, when executed on the computing device, further causes the computing device to:
    responsive to the new set of target patterns failing to satisfying all electrical constraints associated with the initial set of target patterns, determine a new amount and a new direction of retargeting for each of the at least one shape in the set of shapes based on the electrical yield sensitivity of the shape; and
    generate another new set of target patterns with retargeted edges for each shape in the at least one shape based on the new amount and the new direction of retargeting.

10. The computer program product of claim 6, wherein the at least one shape in the set of shapes is at least one of a component of a static random access memory (SRAM) or a component of a latch.

11. An apparatus for electrical yield enhancement retargeting of photolithographic layouts, comprising:
    a processor; and
    a memory coupled to the processor, wherein the memory comprises instructions which, when executed by the processor, cause the processor to:
    perform optical proximity correction on a set of target patterns in order to produce a set of optical proximity correction mask shapes;

generate a set of lithographic contours for each of the set of optical proximity correction mask shapes;
determine electrical yield sensitivities for at least one shape in a set of shapes in the set of target patterns;
determine an amount and a direction of retargeting for each shape in the set of shapes based on the electrical yield sensitivity of the shape;
generate a new set of target patterns with retargeted edges for each shape based on the amount and the direction of retargeting;
determine whether the new set of target patterns with retargeted edges satisfies all electrical constraints; and
responsive to the new set of tarot patterns satisfying all electrical constraints associated with an initial set of target patterns, generate a set of clean mask shapes.

12. The apparatus of claim 11, wherein the electrical yield sensitivity of each shape in the set of shapes is determined by the instructions, when executed by the processor, causing the processor to:
generate a circuit netlist that comprises at least one of circuit connectivity or component parameters; and
perform circuit simulations on the circuit netlist.

13. The apparatus of claim 12, wherein the instructions, when executed by the processor, further cause the processor to:
vary electrically critical layers in the set of target patterns in order to determine the electrical yield sensitivity of each shape in the set of shapes.

14. The apparatus of claim 11, wherein the instructions, when executed by the processor, further cause the processor to:
responsive to the new set of target patterns failing to satisfying all electrical constraints associated with the initial set of target patterns, determine a new amount and a new direction of retargeting for each shape in the set of shapes based on the electrical yield sensitivity of the shape; and
generate another new set of target patterns with retargeted edges thr each shape in the at least one shape based on the new amount and the new direction of retargeting.

15. The apparatus of claim 11, when the at least one shape in the set of shapes is at least one of a component of a static random access memory (SRAM) or a component of a latch.

* * * * *